United States Patent
Heo et al.

(10) Patent No.: US 7,982,318 B2
(45) Date of Patent: Jul. 19, 2011

(54) DEVICE INCLUDING CONTACT STRUCTURE AND METHOD OF FORMING THE SAME

(75) Inventors: Jang-Eun Heo, Seoul (KR);
Young-Moon Choi, Seoul (KR);
Sun-Woo Lee, Incheon-gwangyeoksi (KR); Hong-Sik Yoon, Seoul (KR);
Kyung-Rae Byun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1217 days.

(21) Appl. No.: 11/655,116

(22) Filed: Jan. 19, 2007

(65) Prior Publication Data
US 2010/0264544 A1    Oct. 21, 2010

(30) Foreign Application Priority Data
Jan. 20, 2006   (KR) ............ 10-2006-0006235

(51) Int. Cl.
*H01L 23/52* (2006.01)
*H01L 23/48* (2006.01)
*H01L 29/40* (2006.01)

(52) U.S. Cl. .......... 257/774; 257/E51.04; 257/741; 977/742; 438/610

(58) Field of Classification Search ........ 257/E21.576, 257/E23.01, E23.011, E51.04, 211, 276, 257/296, 302, 349, 376, 508, 522, 712, 741, 257/768, 774; 438/610, 629, 637; 977/742, 977/842, 845
See application file for complete search history.

(56) References Cited

U.S. PATENT DOCUMENTS

| | | | |
|---|---|---|---|
| 6,930,343 B2 * | 8/2005 | Choi et al. | 257/296 |
| 7,135,773 B2 * | 11/2006 | Furukawa et al. | 257/758 |
| 7,348,675 B2 * | 3/2008 | Dubin et al. | 257/774 |
| 7,518,247 B2 * | 4/2009 | Sakamoto et al. | 257/773 |
| 7,535,016 B2 * | 5/2009 | Furukawa et al. | 257/20 |
| 7,656,027 B2 * | 2/2010 | Dangelo et al. | 257/713 |
| 2003/0179559 A1 | 9/2003 | Engelhardt et al. | |
| 2003/0209802 A1 * | 11/2003 | Awano | 257/712 |
| 2004/0182600 A1 * | 9/2004 | Kawabata et al. | 174/250 |
| 2004/0219773 A1 | 11/2004 | Choi et al. | |
| 2004/0251551 A1 * | 12/2004 | Hideki | 257/758 |
| 2006/0249726 A1 * | 11/2006 | Choi et al. | 257/9 |
| 2006/0292861 A1 * | 12/2006 | Furukawa et al. | 438/627 |
| 2007/0148963 A1 * | 6/2007 | Chan et al. | 438/637 |
| 2008/0067912 A1 * | 3/2008 | Ishida | 313/309 |
| 2008/0237858 A1 * | 10/2008 | Nihei | 257/746 |
| 2010/0255674 A1 * | 10/2010 | Byun et al. | 438/626 |

FOREIGN PATENT DOCUMENTS

| | | |
|---|---|---|
| JP | 2005-072171 | 3/2005 |
| KR | 10-2002-0079854 | 10/2002 |
| KR | 10-2004-0008632 | 1/2004 |
| KR | 10-2004-0094065 | 11/2004 |
| KR | 10-2004-0106824 | 12/2004 |

* cited by examiner

*Primary Examiner* — Chris Chu
(74) *Attorney, Agent, or Firm* — Lee & Morse, P.C.

(57) ABSTRACT

A device includes an insulating layer on a substrate having a lower conductive pattern, the insulating layer having a contact hole that penetrates the insulating layer and exposes a portion of the lower conductive pattern, a catalytic pattern having a first portion on the exposed portion of the lower conductive pattern and a second portion on a sidewall of the contact hole, a spacer on the sidewall of the contact hole, wherein the second portion of the catalytic pattern is disposed between the spacer and the sidewall, and a contact plug in the contact hole and contacting the catalytic pattern, the contact plug being a carbon nanotube material.

20 Claims, 7 Drawing Sheets

DEVICE INCLUDING CONTACT STRUCTURE AND METHOD OF FORMING THE SAME

BACKGROUND OF THE INVENTION

1. Field of the Invention

The present invention relates to a device including a contact structure and a method of forming the same.

2. Description of the Related Art

Contact structures may be employed in a number of devices, e.g., semiconductor devices, optoelectronic devices, etc., where it is desired to electrically connect a lower conductive pattern to an upper conductive pattern. A contact structure may be, e.g., a contact pattern such as a plug that is formed in a via or hole passing through a layer that separates the upper and lower conductive patterns. For example, the contact structure may be a contact plug that penetrates an insulating layer interposed between the lower conductive pattern and the upper conductive pattern. A lower end and an upper end of the contact plug may be connected to the lower and upper conductive patterns, respectively, in order to electrically connect the lower and upper conductive patterns.

In order to increase the degree of integration of a device including the contact structure, it may be desirable to reduce the size of the contact structure. For example, where the contact structure is a contact plug having a generally cylindrical shape, it may be desirable to reduce the diameter of the contact plug. However, reducing the size of the contact structure may impact the ability of the structure to carry an electrical current. Moreover, if the amount of current flowing through the contact structure decreases, characteristics of the device may be degraded. For example, if the current is not sufficiently supplied or discharged, a signal delay or the like may occur, which may generate an operational error in the device. This may make it difficult to reduce the size of the contact structure, may lower an operation speed of the device, etc.

One approach to reducing the size of the contact structure is to form a contact plug of a metal-containing material, e.g., copper, titanium nitride, etc. For example, copper may support a current flow per unit area, i.e., a current density, of up to about $10^7$ A/cm$^2$. Similarly, titanium nitride may support a current density of up to about $10^8$ A/cm$^2$. However, a contact plug formed of copper or titanium nitride may still require a diameter of the contact plug of 50 nm or more. That is, if the diameter of the contact plug is smaller than about 50 nm, the characteristics of the device may be degraded. Accordingly, there is a need for a device suitable for a high degree of integration and/or high-speed operation, and a method of forming the same.

SUMMARY OF THE INVENTION

The present invention is therefore directed to a device including a contact structure and method of forming the same, which substantially overcome one or more of the problems due to the limitations and disadvantages of the related art.

It is therefore a feature of an embodiment of the present invention to provide a device having a carbon nanotube contact structure.

It is therefore another feature of an embodiment of the present invention to provide a method of forming contact structure that includes an efficient formation of a catalytic layer.

At least one of the above and other features and advantages of the present invention may be realized by providing a device, including an insulating layer on a substrate having a lower conductive pattern, the insulating layer having a contact hole that penetrates the insulating layer and exposes a portion of the lower conductive pattern, a catalytic pattern having a first portion on the exposed portion of the lower conductive pattern and a second portion on a sidewall of the contact hole, a spacer on the sidewall of the contact hole, wherein the second portion of the catalytic pattern is between the spacer and the sidewall, and a contact plug in the contact hole, the contact plug being a carbon nanotube material in contact with the catalytic pattern.

The device may further include an upper conductive pattern on the insulating layer and contacting the contact plug. The spacer may be an insulating material having etch selectivity with respect to the catalytic pattern. The catalytic pattern may include a metal-containing material that catalyzes the growth of carbon nanotube. The metal-containing material may include at least one of nickel, aluminum, cobalt, molybdenum, platinum, yttrium, iridium, iron, zirconium, chromium, calcium, lanthanum, titanium, tungsten, tungsten silicide, cobalt silicide, nickel silicide, titanium silicide, titanium tungsten, and oxides thereof. The first portion of the catalytic pattern may have a thickness of about 5 Å to about 500 Å.

At least one of the above and other features and advantages of the present invention may also be realized by providing a method of forming a contact structure, including patterning an insulating layer on a substrate having a lower conductive pattern so as to form a contact hole that penetrates the insulating layer and exposes a portion of the lower conductive pattern, forming a catalytic layer on the insulating layer, the catalytic layer having a first portion on the exposed portion of the lower conductive pattern and a second portion on a sidewall of the contact hole, forming a spacer on the sidewall of the contact hole, wherein the second portion of the catalytic layer is disposed between the spacer and the sidewall, and forming a contact plug on the first portion of the catalytic layer, the contact plug being a carbon nanotube material.

Forming the spacer may include conformally forming a spacer layer that covers at least the first and second portions of the catalytic layer, and anisotropically etching the spacer layer so as to expose the first portion of the catalytic layer. The catalytic layer may further include a third portion on a top surface of the insulating layer, and the method may further include removing the third portion of the catalytic layer before forming the spacer layer. Removing the third portion of the catalytic layer may include forming a sacrificial passivation layer on the catalytic layer, removing the third portion of the catalytic layer by planarizing the sacrificial passivation layer and the catalytic layer until the insulating layer is exposed, and removing the planarized sacrificial passivation layer from the contact hole. The third portion of the catalytic layer may be removed through a chemical mechanical polishing process immediately after forming the catalytic layer.

An etching gas used in the anisotropic etching may include a chemical etching gas including carbon and fluorine, and a physical etching gas. The chemical etching gas may include at least one of a carbon tetrafluoride gas and a trifluoromethane gas, and the physical etching gas may include at least one of an oxygen gas and an argon gas. The anisotropic etching may include providing a back bias of about 1 watts to about 10 watts.

Forming the contact plug may include growing a carbon nanotube higher than a top surface of the insulating layer, the carbon nanotube being grown from the first portion of the catalytic layer, and removing a portion of the carbon nanotube that protrudes higher than the top surface of the insulating layer. Removing the protruding portion of the carbon nanotube may include forming a sacrificial planarization layer on the insulating layer, the sacrificial planarization layer covering the protruding portion of the carbon nanotube, and planarizing the sacrificial planarization layer and the protruding portion of the carbon nanotube until the top surface of the insulating layer is exposed. The method may further include performing a plasma pre-treatment using an ammonia gas on the first portion of the catalytic layer before growing the carbon nanotube.

The method may further include forming an upper conductive pattern on the insulating layer, the upper conductive pattern contacting the contact plug. The catalytic layer may further include a third portion on a top surface of the insulating layer, and the method may further include removing the third portion of the catalytic layer after forming the spacer. Third portion of the catalytic layer may be removed using a chemical mechanical polishing process.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 2006-06235, filed on Jan. 20, 2006, in the Korean Intellectual Property Office, and entitled: "Semiconductor Devices Including Contact Structure and Methods of Forming the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
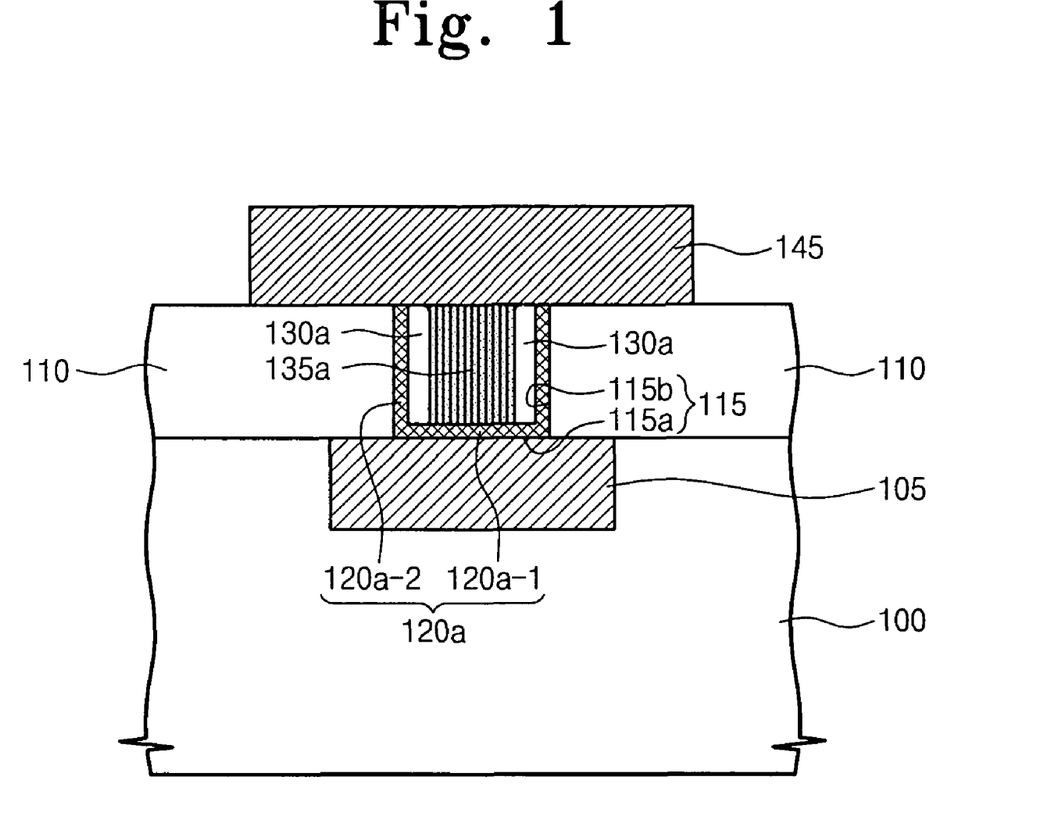
FIG. 1 illustrates a cross-sectional view of a device including a contact structure according to an embodiment of the present invention.

FIG. 1 illustrates a cross-sectional view of a device including a contact structure according to an embodiment of the present invention. Referring to FIG. 1, the device may include an insulating layer 110 disposed on a substrate 100 having a lower conductive pattern 105.

The insulating layer 110 may be, e.g., an interlayer insulating layer, and may be formed of, e.g., an oxide, etc. The substrate 100 may include, e.g., a semiconductor substrate such as a single-crystalline substrate, an insulating material, etc., and may include one or more layers, patterns, etc., below the insulating layer 110 and/or the lower conductive pattern 105. For clarity, the substrate 100 will be described as a single layer.

The lower conductive pattern 105 may be disposed on the substrate 100, e.g., on a lower insulating layer, or may be formed in the substrate 100, e.g., using a Damascene technique to form the lower conductive pattern 105 in a lower insulating layer, etc. The lower conductive pattern 105 may have a shape that is, e.g., a generally linear shape, an island shape (in plan view) such as a buffer conductive pattern, etc.

An upper surface of the lower conductive pattern 105 may be covered by the insulating layer 110. The lower conductive pattern 105 may include, e.g., impurity-doped silicon, metals such as tungsten, copper, aluminum, molybdenum, etc., conductive metal nitrides such as titanium nitride, tantalum nitride, etc., metal silicides such as tungsten silicide, cobalt silicide, etc.

In further detail, the device may include a catalytic pattern 120a disposed on a portion of the lower conductive pattern 105 that is exposed by a contact hole 115 that penetrates the insulating layer 110. The catalytic pattern 120a may be formed from a catalytic layer 120, as further described below. In an implementation, the catalytic pattern 120a may be disposed at the bottom 115a and on the sidewalls 115b of the contact hole 115. The contact hole 115 may have a shape that is, e.g., generally cylindrical, elongated, etc.

Where the catalytic pattern 120a is formed at the bottom 115a of the contact hole 115, i.e., on the lower conductive pattern 105 exposed by the contact hole 115, and on a sidewall of the contact hole 115, the catalytic pattern 120a may be in contact with the lower conductive pattern 105 at the bottom 115a of the contact hole 115.

For clarity, the catalytic pattern 120a will be referred to as including a plurality of portions. It will be appreciated, however, that this is merely for descriptive purposes, and the catalytic pattern 120a may be formed by a process that forms each of the portions concurrently as a monolithic pattern, by a process that forms the portions separately, etc.

Specifically, the catalytic pattern 120a may include a first portion 120a-1 and a second portion 120a-2. The first portion 120a-1 of the catalytic pattern 120a may be disposed on the portion of the lower conductive pattern 105 that is exposed by the contact hole 115, that is, at the bottom 115a of the contact hole 115. The second portion 120a-2 of the catalytic pattern 120a may be disposed on the sidewall 115b of the contact hole 115.

The catalytic pattern 120a may be formed of a metal-containing material that catalyzes the growth of carbon nanotubes, e.g., a material including one or more of nickel (Ni), aluminum (Al), cobalt (Co), molybdenum (Mo), platinum (Pt), yttrium (Y), iridium (Ir), iron (Fe), zirconium (Zr), chromium (Cr), calcium (Ca), lanthanum (La), titanium (Ti), tungsten (W), tungsten silicide (WSi), cobalt silicide (CoSi), nickel silicide (NiSi), titanium silicide (TiSi), and titanium tungsten (TiW), oxides of such materials, combinations of such materials with oxides thereof, etc.

The thickness of the catalytic pattern 120a may be about 5 Å to about 500 Å. In an implementation, the thickness of the catalytic pattern 120a may be about 50 Å. The thickness of the catalytic pattern 120a may particularly refer to the thickness of the first portion 120a-1 of the catalytic pattern 120a, i.e., the thickness on the lower conductive pattern 105.

Where the catalytic pattern 120a is formed at the bottom 115a of the contact hole 115 and on the sidewall 115b of the contact hole 115, a spacer 130a may be disposed in the contact hole 115 to cover the sidewall 115b of the contact hole 115. That is, the second portion 120a-2 of the catalytic pattern 120a may be interposed between the spacer 130a and the sidewall 115b of the contact hole 115, so as to cover the second portion 120a-2. In an implementation, the spacer 130a may cover a periphery of the first portion 120a-1 of the catalytic pattern 120a, and the center of the first portion 120a-1 of the catalytic pattern 120a may be exposed by the spacer 130a.

The spacer 130a may be formed of, e.g., an insulating material having etch selectivity with respect to the catalytic pattern 120a. For example, the spacer 130a may be formed of one or more of a nitride layer and an oxide layer.

A contact plug 135a may be disposed in the contact hole 115. The contact plug 135a may contact the first portion 120a-1 of the catalytic pattern 120a. In an implementation, the contact plug 135a may contact the center of the first portion 120a-1 of the catalytic pattern 120a, and the spacer 130a may be interposed between the contact plug 135a and the second portion 120a-2 of the catalytic pattern 120a.

A top surface of the contact plug 135a may be generally coplanar with a top surface of the insulating layer 110. In an implementation, the top surface of the contact plug 135a may be generally coplanar with a top surface of the second portion 120a-2 of the catalytic pattern 120a and with at least a part of a top surface of the spacer 130a. The contact plug 135a may be formed of carbon nanotubes 135, as further described below.

An upper conductive pattern 145 may be disposed on the insulating layer 110. The upper conductive pattern 145 may contact the contact plug 135a for an electrical connection. The contact plug 135a may electrically connect the lower and upper conductive patterns 105 and 145 that are insulated from each other by the insulating layer 110. The upper conductive pattern 145 may have a shape that is, e.g., generally linear, an island shape (in plan view) such as a buffer conductive pattern, etc. In an implementation (not shown), the upper conductive pattern 145 may be disposed in an upper insulating layer formed on the insulating layer 110. The upper conductive pattern 145 may include, e.g., impurity-doped silicon, metals such as tungsten, copper, aluminum, molybdenum, etc., conductive metal nitrides such as titanium nitride, tantalum nitride, etc., metal silicides such as tungsten silicide, cobalt silicide, etc.

As described above, a device according to an embodiment of the present invention may include the contact plug 135a formed of carbon nanotubes 135. The current density of carbon nanotubes may be greater than about $10^9$ A/cm$^2$. Thus, the contact plug 135a may support a current flow through the contact plug 135a that is significantly greater than that of a conventional contact plug. Accordingly, a device according to an embodiment of the present invention may be suitable for a high degree of integration and/or high-speed operation.

In an implementation, as described above, the second portion 120a-2 of the catalytic pattern 120a formed on the sidewall 115b of the contact hole 115 may be covered with the spacer 130a. Accordingly, the carbon nanotubes 135 may not grow from the second portion 120a-2 of the catalytic pattern 120a and may only grow upward from the center part of the first portion 120a-1. As a result, the contact plug 135a may be formed without voids, which may reduce or prevent degradation of electrical characteristics of the contact plug 135a.

Figure 2:
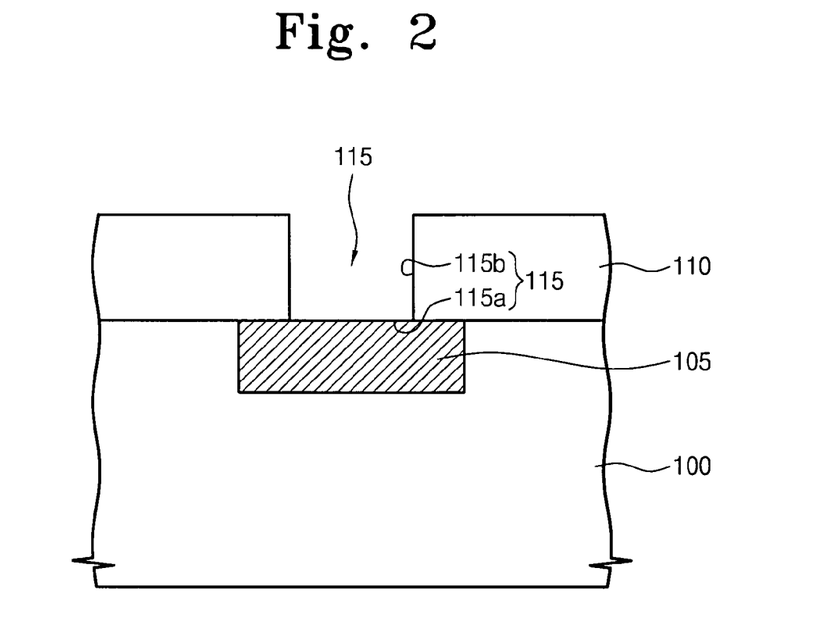
FIGS. 2 through 8 illustrate cross-sectional views of stages in a method of forming a device including a contact structure according to another embodiment of the present invention.

A method of forming a semiconductor device including a contact structure according to an embodiment of the present invention will now be described with reference to FIGS. 2 through 8. Referring to FIG. 2, the insulating layer 110 may be formed on the substrate 100 that has the lower conductive pattern 105. The substrate 100 may include, e.g., a semiconductor substrate, a lower insulating layer formed on a substrate, etc., as described above.

The lower conductive pattern 105 may be formed on a lower insulating layer (not shown) through a patterning process, or may be formed in a lower insulating layer using a Damascene technique, etc. The lower conductive pattern 105 may have a shape that is, e.g., a generally linear shape, an island shape (in plan view) such as a buffer conductive pattern, etc. The insulating layer 110 may be patterned to form the contact hole 115 exposing the lower conductive pattern 105.

Figure 3:
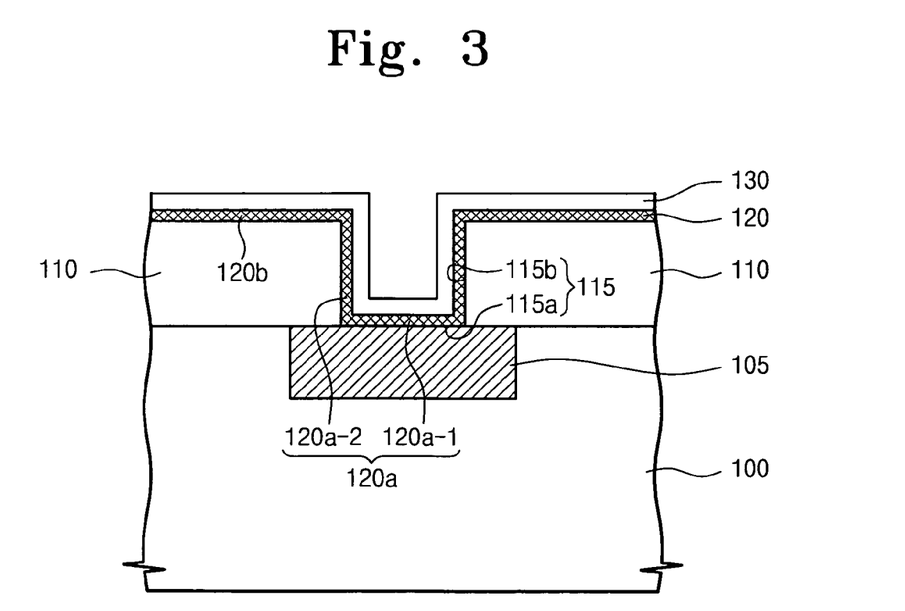

Referring to FIG. 3, a catalytic layer 120 may be formed on the substrate 100. The catalytic layer 120 may form the first portion 120a-1 and the second portion 120a-2 of the catalytic pattern 120a at the bottom 115a of the contact hole 115 and on the sidewall 115b of the contact hole 115, respectively, as well as a third portion 120b on the insulating layer 110, respectively. The first portion 120a-1 may be on an upper surface of the lower conductive pattern 105 that is exposed by the contact hole 115.

The catalytic layer 120 may be formed of a metal-containing material that catalyzes the growth of carbon nanotubes, e.g., a material including one or more of Ni, Al, Co, Mo, Pt, Y, Ir, Fe, Zr, Cr, Ca, La, Ti, W, WSi, CoSi, NiSi, TiSi, and TiW, oxides of such materials, combinations of such materials with oxides thereof, etc.

The catalytic layer 120 may be formed to a thickness of about 5 Å to about 500 Å. In an implementation, the thickness of the catalytic layer 120 may be about 50 Å. The thickness of the catalytic layer 120 may particularly refer to the thickness for the first portion 120a-1 of the catalytic pattern 120a, i.e., the thickness of the catalytic layer 120 on the lower conductive pattern 105. The catalytic layer 120 may be formed by, e.g., a chemical vapor deposition (CVD) process, an evaporation process, a physical vapor deposition (PVD) process, an atomic layer deposition (ALD) process, an ion-implantation process, etc.

An exemplary process of forming the catalytic layer 120 by ion implantation will now be described. The catalytic layer 120 may be formed by implanting ion components of the aforementioned metal-containing materials into an upper surface of the insulating layer 110, a surface of the sidewall 115b of the contact hole 115, and a surface of the lower conductive pattern 105 exposed by the contact hole 115. The ions may be vertically implanted and/or implanted at an angle. When the catalytic layer 120 is formed by ion implantation, the first portion 120a-1 of the catalytic pattern 120a may include some components of the insulating layer 110 and the second portion 120a-2 of the catalytic pattern 120a may include some components of the lower conductive pattern 105. Similarly, the third portion 120b of the catalytic layer 120 may include some components of the insulating layer 110.

A spacer layer 130 may be formed on the catalytic layer 120, e.g., using a conformal process. As illustrated in FIG. 3, the spacer layer 130 may cover the first, second and third portions 120a-1, 120a-2 and 120b. The spacer layer 130 may be formed of, e.g., an insulating layer having etch selectivity with respect to the catalytic layer 120. For example, the spacer layer 120 may be formed of one or more of a nitride layer and an oxide layer.

Figure 4:
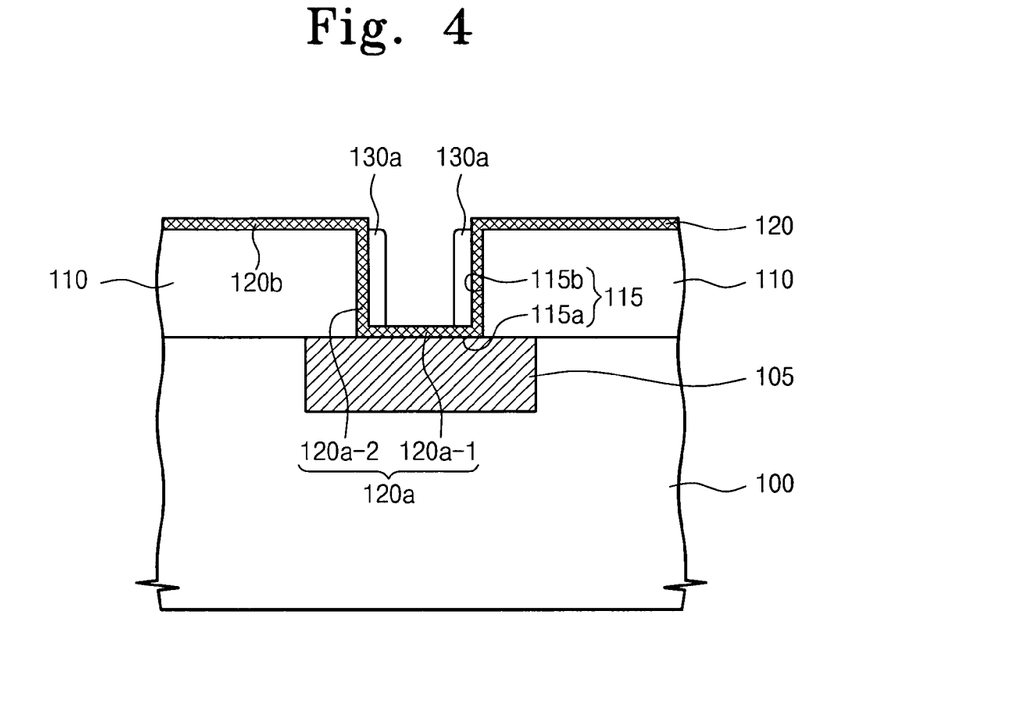

Referring to FIG. 4, the spacer layer 130 may be anisotropically etched using an anisotropic etching process to expose the first portion 120a-1, thereby forming the spacer 130a covering the sidewall 115b of the contact hole 115. In an implementation, the spacer 130a may cover a periphery of the first portion 120a-1 of the catalytic pattern 120a, and the center of the first portion 120a-1 of the catalytic pattern 120a may be exposed by the spacer 130a. Forming the spacer 130a may expose the third portion 120b of the catalytic layer 120.

An etch gas for the anisotropic etching process may include a chemical etching gas, i.e., a gas that etches the spacer layer 130 mainly by a chemical reaction, and a physical etching gas, i.e., a gas that etches the spacer layer 130 mainly by a physical action. The chemical etching gas may include carbon and fluorine. For example, the chemical etching gas may include one or more of a carbon tetrafluoride ($CF_4$) gas and a trifluoromethane ($CHF_3$) gas. The physical gas may include one or more of oxygen ($O_2$) gas and argon (Ar) gas.

In an implementation, the etching gas may include $CF_4$ gas, $CHF_3$ gas, $O_2$ gas, and Ar gas. This etch gas may provide an etch rate of the spacer layer 130 that is much higher, e.g., more than 100 times, than the etch rate of the catalytic layer 120.

A back bias for accelerating a plasma etching gas may be provided at a low level, e.g., ranging from about 1 watts (W) to about 10 W, in the anisotropic etching process. In an implementation, the back bias may be about 5 W. Accordingly, an acceleration force of the plasma etching gases may be lowered. As a result, a chemical etching force may be increased as compared to a physical etching force, so that the etch rate of the spacer layer 130 may be much higher than that of the catalytic layer 120.

Figure 5:
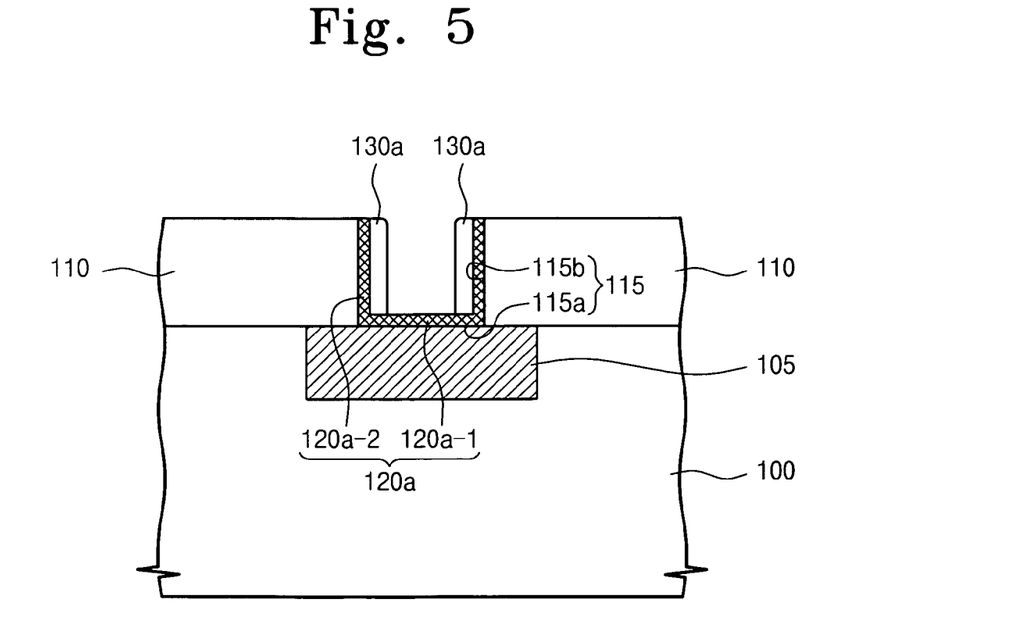

Referring to FIG. 5, the third portion 120b of the catalytic layer 120, i.e., the portion on the insulating layer 110, may be removed to form the catalytic pattern 120a in the contact hole 115. The first portion 120a-1 of the catalytic pattern 120a may be formed at the bottom 115a of the contact hole 115, and the second portion 120a-2 may be formed on the sidewall 115b of the contact hole 115, as described above. Further, the periphery of the first portion 120a-1 of the catalytic pattern 120a may be covered by the spacer 130a, and the center of the first portion 120a-1 of the catalytic pattern 120a may be exposed. The third portion 120b of the catalytic layer 120 may be removed by a chemical mechanical polishing (CMP) process, which may allow the third portion 120b to be removed without etch damage to the catalytic pattern 120a.

Figure 6:
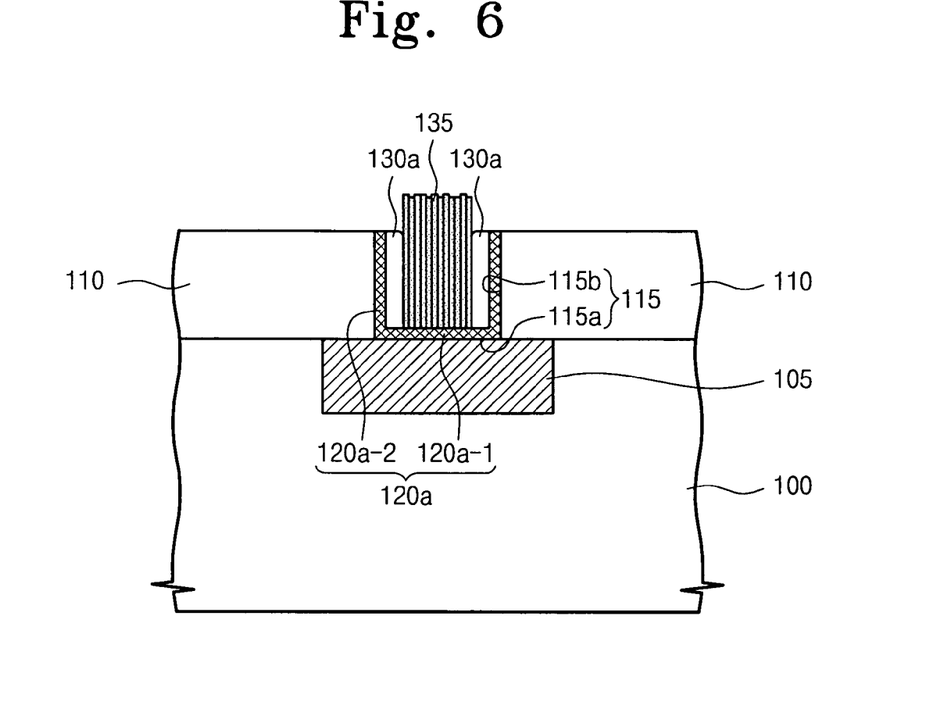

Referring to FIG. 6, a carbon nanotube growth process may be performed on the substrate 100 having the catalytic pattern 120a and the spacer 130a. In particular, one or more carbon nanotubes 135 may be grown from the exposed part of the first portion 120a-1 of the catalytic pattern 120a. A side surface of the second portion 120a-2 of the catalytic pattern 120a may be covered with the spacer 130a and, accordingly, the carbon nanotubes 135 may grow upward from the exposed part of the first portion 120a-1. That is, the carbon nanotubes 135 may be selectively formed, using the catalytic pattern 120a and the spacer 130a, so as to grow upward from the bottom 115a of the contact hole 115. Consequently, the carbon nanotubes 135 may have few or no voids and may exhibit excellent electrical properties.

The carbon nanotubes 135 may be formed to extend higher than the top surface of the insulating layer 110, in which case the carbon nanotubes 135 may include a portion protruding higher than the insulating layer 110. The carbon nanotubes 135 may not grow from the top surface of the insulating layer 110 because no catalytic pattern 120a may exist on the top surface of the insulating layer 110.

As illustrated in FIG. 6, an uppermost edge of the second portion 120a-2 of the catalytic pattern 120a may be exposed. Accordingly, extraneous carbon nanotubes (not shown) may have a tendency to grow from the exposed uppermost surface of the second portion 120a-2 of the catalytic pattern 120a, although in practice such growth may not occur because the thickness of the edge of the second portion 120a-2 may be too small. That is, the area of the uppermost surface of the second portion 120a-2 of the catalytic pattern 120 may be too small for extraneous carbon nanotube growth.

The carbon nanotubes 135 may be formed by, e.g., a CVD process using a process gas including a carbon source gas such as an AP CVD process, a thermal CVD process, a plasma CVD process, an electro cyclotron resonance (ECR) CVD process, etc., by an ALD process, etc. The carbon source gas may include or more of, e.g., hydrocarbon gases such as $C_2H_4$, $CH_4$, etc., CO, $CO_2$, methanol, ethanol, halocarbon gases such as $C_4F_6$, etc. The process gas may further include a carrier gas, which may be an inert gas such as Ar, nitrogen gas, helium gas, etc. In an implementation, the carbon nanotubes 135 may be formed at a process temperature of about 400° C. to about 900° C.

Before the carbon nanotubes 135 are formed, plasma pre-treatment, e.g., using an ammonia ($NH_3$) gas, may be performed on an exposed part of the catalytic pattern 120a. Plasma pre-treatment may accelerate the growth of the carbon nanotubes 135.

Figure 7:
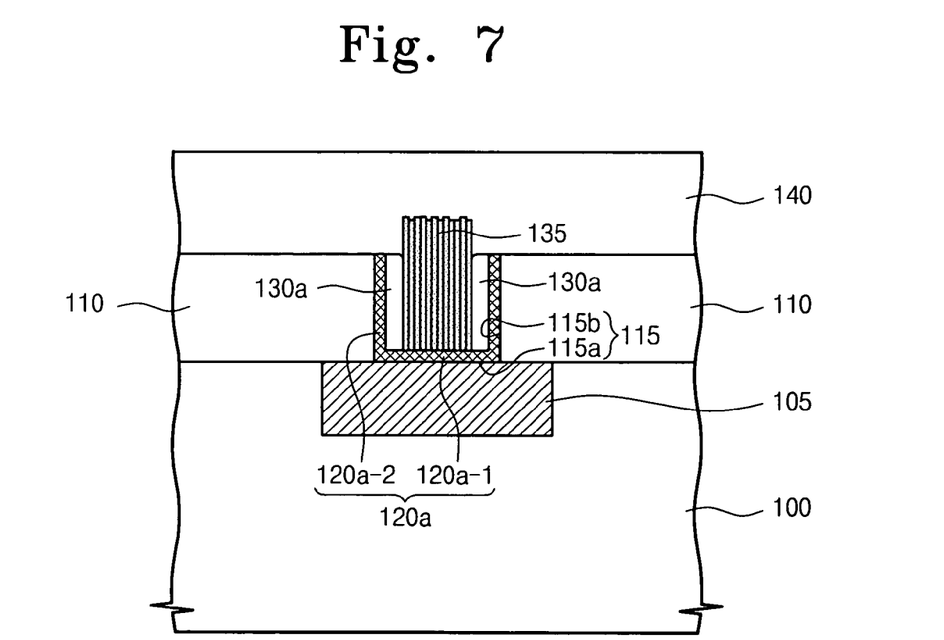

Referring to FIG. 7, a sacrificial planarization layer 140 may be formed across the surface of the substrate 100. The sacrificial planarization layer 140 may cover any protruding portions of the carbon nanotubes 135, as well as the insulating layer 110. The sacrificial planarization layer 140 may be formed of a material having an etch selectivity with respect to the insulating layer 110. In an implementation, the sacrificial planarization layer 140 may be formed of a material that is similar to that of the carbon nanotube 135. For example, the sacrificial planarization layer 140 may be formed of a photoresist layer, which may be a polymer material containing carbon.

Figure 8:
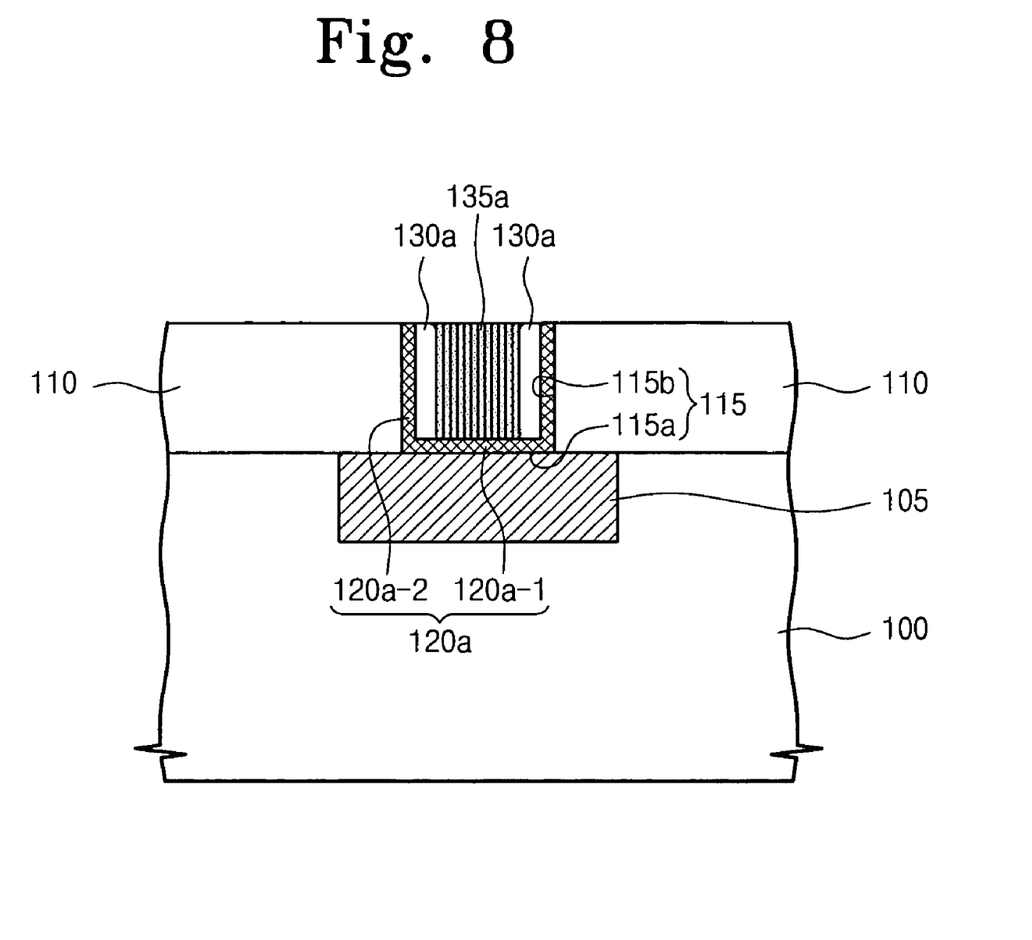

Referring to FIG. 8, the sacrificial planarization layer 140 and the carbon nanotubes 135 may be planarized until the insulating layer 110 is exposed, thereby forming the contact plug 135a in the contact hole 115. The sacrificial planarization layer 140 may be completely removed through the planarization process. If extraneous carbon nanotubes (not shown) were formed on the uppermost surface of the second portion 120a-2 of the catalytic pattern 120a, such extraneous carbon nanotubes may also be removed.

In another implementation, the sacrificial planarization layer 140 may be omitted, and the carbon nanotubes 135 may be formed to a height corresponding to the top surface of the insulating layer 110, e.g., by controlling the process time used to grow the carbon nanotubes 135. In this case, the carbon nanotubes 135 may be formed as the contact plug 135a, without forming and planarizing the sacrificial planarization layer 140. In this case, it is preferable that the extraneous carbon nanotubes not be formed.

After formation of the contact plug 135a, subsequent operations may then be employed to form the upper conductive pattern 145, as illustrated in FIG. 1. It will be appreciated that such operations are within the level of one of ordinary skill in the art, and may vary considerably depending on the particular nature of the device being fabricated. An upper end of the contact plug 135a may be electrically connected to the upper conductive pattern. The upper conductive pattern 145 may have a shape that is, e.g., generally linear, an island shape (in plan view) such as a buffer conductive pattern, etc. In an implementation (not shown), the upper conductive pattern 145 may be disposed in an upper insulating layer formed on the insulating layer 110. The upper conductive pattern 145 may include, e.g., impurity-doped silicon, metals such as tungsten, copper, aluminum, molybdenum, etc., conductive metal nitrides such as titanium nitride, tantalum nitride, etc., metal silicides such as tungsten silicide, cobalt silicide, etc.

As described above, the second portion 120a-2 of the catalytic pattern 120a may be covered with the spacer 130a. Thus, the carbon nanotubes 135 may grow upward from the bottom 115a of the contact hole 115, and may not grow from the second portion 120a-2 of the catalytic pattern 120a formed on the sidewall of the contact hole 115. Therefore, the contact plug 135a may have excellent electrical characteristics.

If the carbon nanotubes 135 grow from the side surface of the second portion 120a-2 of the catalytic pattern 120a, carbon nanotubes 135 within the contact plug 135a may be irregularly arranged and some carbon nanotubes 135 may grow from an upper portion of the contact hole 115, which may result in generation of a void within the contact plug 135. Consequently, the electrical characteristics of the contact plug 135 may be degraded. However, such lowering of the electrical characteristics of the contact plug 135a may be prevented in accordance with an embodiment of the present invention, wherein the second portion 120a-2 of the catalytic pattern 120a is covered with the spacer 130a.

During the anisotropic etching process for forming the spacer 130a, the etch selectivity between the spacer layer 130 and the catalytic layer 120 may be very high. Thus, the catalytic layer 120 may be formed very thin, yet etch damage to the catalytic layer 120 may be minimized when forming the spacer 130a. This thin catalytic layer 120 may yield a correspondingly thin exposed edge of the second portion 120a-2 at the upper surface of the insulation layer 110, which may reduce or prevent the formation of extraneous carbon nanotubes there.

As described above, the spacer 130a may be formed before the catalytic layer 120 is processed to form the catalytic pattern 120a. In another sequence, the catalytic pattern 120a may be formed first, and then the spacer 130a may be formed. This sequence will now be described with reference to FIGS. 9 through 11, which illustrate cross-sectional views of stages in a method of forming a spacer or a catalytic pattern of a device according to still another embodiment of the present invention.

In the following description, the formation of the lower conductive pattern 105, the contact hole 115, and the catalytic layer 120 may be similar to the operations described above. Accordingly, in the following description, details thereof may not be repeated.

Figure 9:
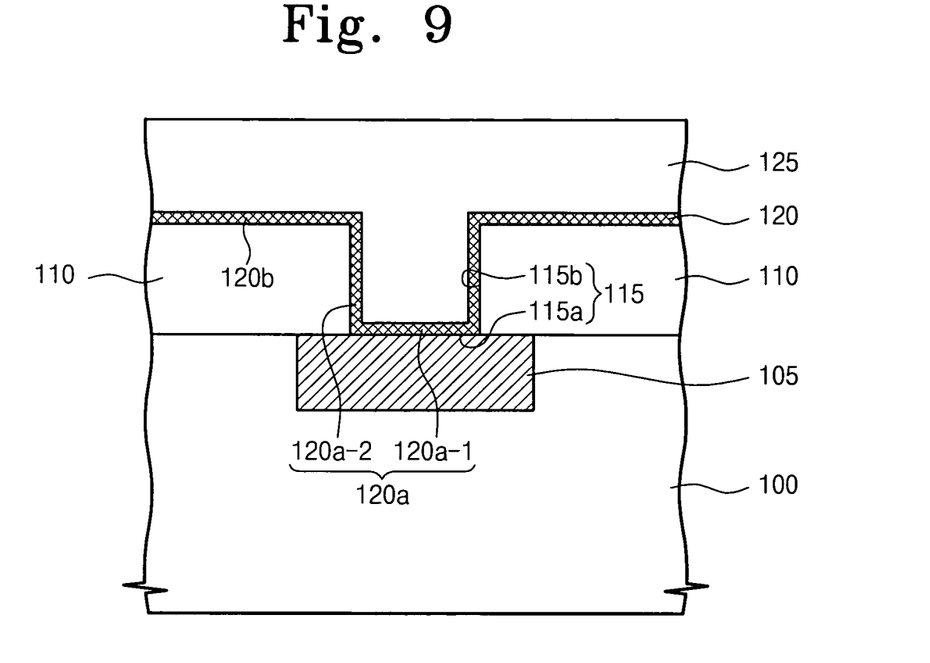
FIGS. 9 through 11 illustrate cross-sectional views of stages in a method of forming a spacer or a catalytic pattern of a device according to still another embodiment of the present invention.

Referring to FIG. 9, a sacrificial passivation layer 125 may be formed on the substrate 100 having the catalytic layer 120. The sacrificial passivation layer 125 may cover the entire catalytic layer 120, and the contact hole 115 may be filled with the sacrificial passivation layer 125. The sacrificial passivation layer 125 may be formed of a material having an etch selectivity with respect to the catalytic layer 120. Furthermore, the sacrificial passivation layer 125 may be formed of a material having an etch selectivity with respect to the insulating layer 110. For example, the sacrificial passivation layer 125 may be formed of a spin on glass (SOG) layer, a photoresist layer, etc. When a SOG layer is used as the sacrificial passivation layer 125, a CVD oxide layer may be used as the insulating layer 110.

Figure 10:
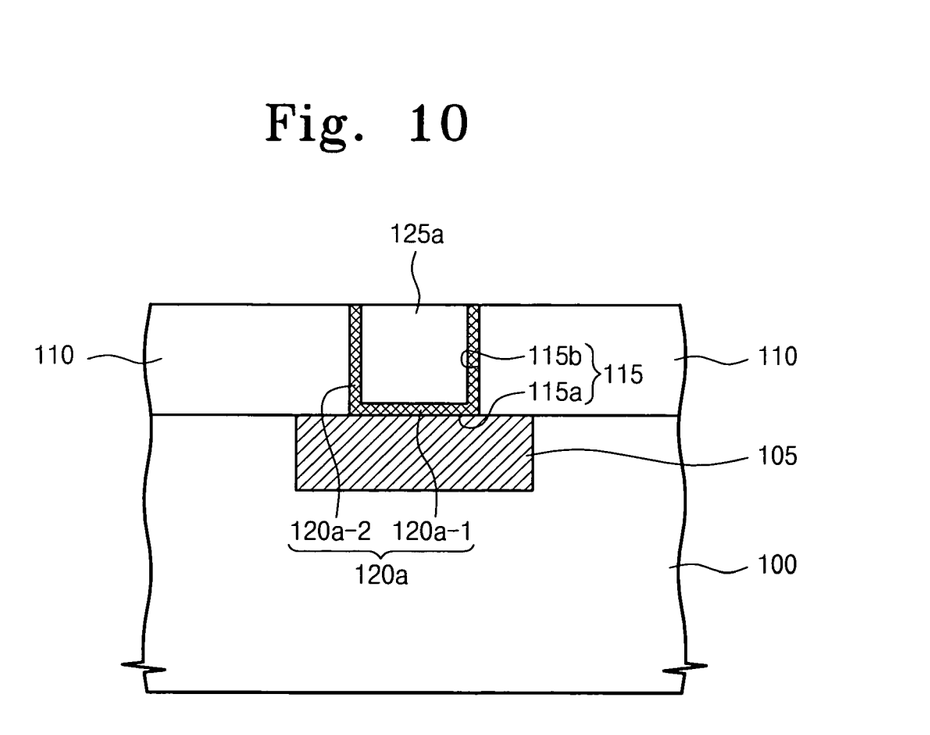
Figure 11:
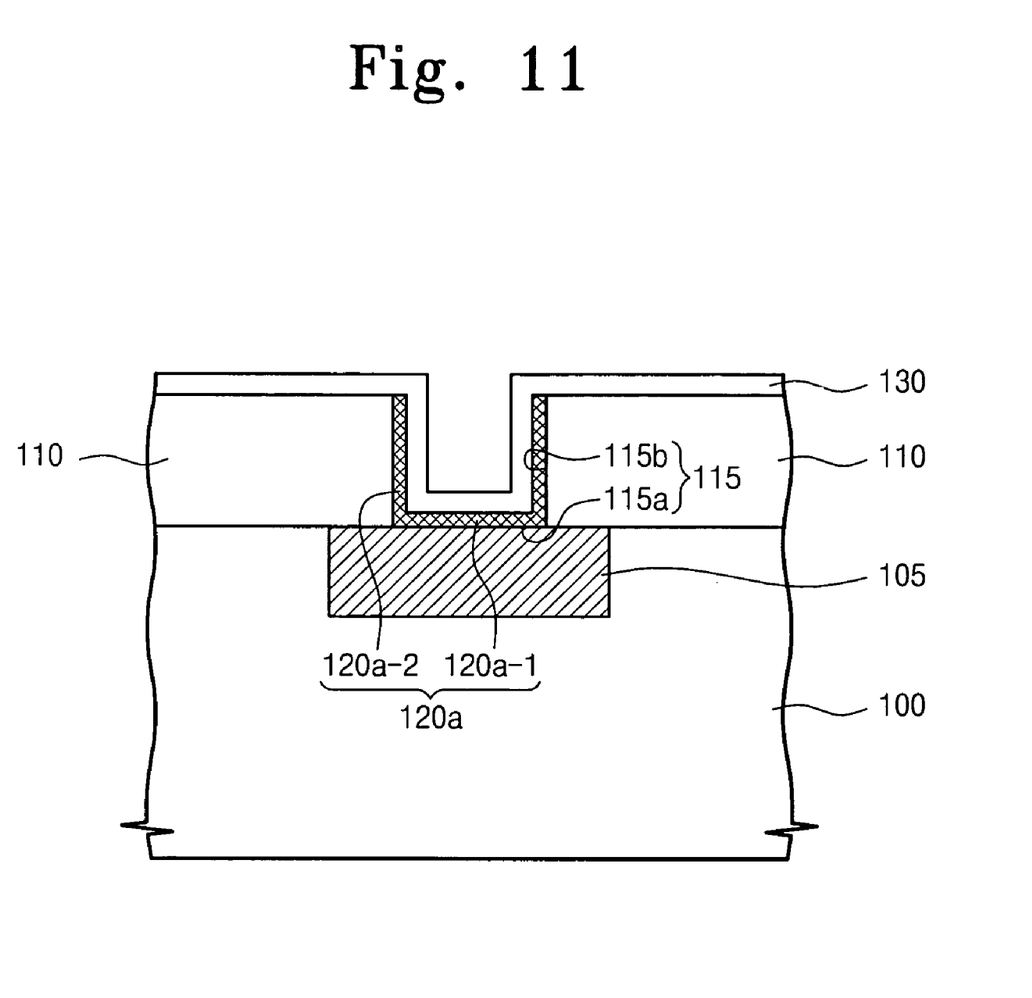

Referring to FIG. 10, the sacrificial passivation layer 125 and the catalytic layer 120 may be successively planarized until the insulating layer 110 is exposed. Accordingly, the third portion 120b of the catalytic layer 120 on the insulating layer 110 may be removed, leaving the catalytic pattern 120a in the contact hole 115. A sacrificial passivation pattern 125a may be formed in the catalytic pattern 120a within the contact hole 115. The process of planarizing the sacrificial passivation layer 125 and the catalytic layer 120 may be performed by, e.g., a blanket etch-back, CMP, etc. Then, referring to FIG. 11, the sacrificial passivation pattern 125a may be removed to expose the catalytic pattern 120a.

In an implementation (not shown), the sacrificial passivation layer 125 may be omitted. In this case, the third portion 120b of the catalytic layer 120 on the insulating layer 110 may be removed, e.g., by CMP, right after the catalytic layer 120 is formed.

Referring again to FIG. 11, the spacer layer 130 may be formed on the substrate 100 having the exposed catalytic pattern 120a, e.g., using a conformal process. The spacer layer 130 may cover the catalytic pattern 120a and the upper surface of the insulating layer 100. Thereafter, the spacer layer 130 may be anisotropically etched to form the spacer 130a that is shown in FIG. 5. The anisotropic etching may be performed in the same manner as described above with reference to FIG. 5. Subsequent processes may be performed in the same manner as described above with reference to FIGS. 6 through 8.

As described above, embodiments of the present invention may provide a device having a contact plug that electrically connects lower and upper conductive patterns, the contact plug being formed of carbon nanotubes that provide very high current density. Thus, the device may provide an increased current flow through the contact plug, which may enable formation of a device having a high degree of integration and/or high-speed operation.

As described above, a spacer may cover the portion of the catalytic pattern formed on the sidewall of the contact hole, such that carbon nanotubes that form the contact plug selectively grow upward from the bottom of the contact hole. Accordingly, the contact plug may be formed of carbon nanotubes having excellent electrical characteristics.

Furthermore, an anisotropic etching process may be employed to form the spacer, the process providing excellent etch selectivity with respect to the spacer layer and the catalytic layer. Consequently, even if the catalytic layer is very thin, the spacer may be formed while minimizing etch damage to the catalytic layer.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A device, comprising:
an insulating layer on a substrate having a lower conductive pattern, the insulating layer having a contact hole that penetrates the insulating layer and exposes a portion of the lower conductive pattern;
a catalytic pattern having a first portion on the exposed portion of the lower conductive pattern and a second portion on a sidewall of the contact hole;

a spacer on the sidewall of the contact hole, wherein the second portion of the catalytic pattern is between the spacer and the sidewall; and a contact plug in the contact hole, the contact plug being a carbon nanotube material in contact with the catalytic pattern.

2. The device as claimed in claim 1, further comprising an upper conductive pattern on the insulating layer and contacting the contact plug.

3. The device as claimed in claim 1, wherein the spacer is an insulating material having etch selectivity with respect to the catalytic pattern.

4. The device as claimed in claim 1, wherein the catalytic pattern includes a metal-containing material that catalyzes the growth of carbon nanotube.

5. The device as claimed in claim 4, wherein the metal-containing material includes at least one of: nickel, aluminum, cobalt, molybdenum, platinum, yttrium, iridium, iron, zirconium, chromium, calcium, lanthanum, titanium, tungsten, tungsten silicide, cobalt silicide, nickel silicide, titanium silicide, titanium tungsten, and oxides thereof.

6. The device as claimed in claim 1, wherein the first portion of the catalytic pattern has a thickness of about 5 Å to about 500 Å.

7. A method of forming a contact structure, comprising:
patterning an insulating layer on a substrate having a lower conductive pattern so as to form a contact hole that penetrates the insulating layer and exposes a portion of the lower conductive pattern;

forming a catalytic layer on the insulating layer, the catalytic layer having a first portion on the exposed portion of the lower conductive pattern and a second portion on a sidewall of the contact hole;

forming a spacer on the sidewall of the contact hole, wherein the second portion of the catalytic layer is disposed between the spacer and the sidewall; and forming a contact plug on the first portion of the catalytic layer, the contact plug being a carbon nanotube material.

8. The method as claimed in claim 7, wherein forming the spacer comprises:
conformally forming a spacer layer that covers at least the first and second portions of the catalytic layer; and
anisotropically etching the spacer layer so as to expose the first portion of the catalytic layer.

9. The method as claimed in claim 8, wherein the catalytic layer further includes a third portion on a top surface of the insulating layer, the method further comprising removing the third portion of the catalytic layer before forming the spacer layer.

10. The method as claimed in claim 9, wherein removing the third portion of the catalytic layer comprises:
forming a sacrificial passivation layer on the catalytic layer;

removing the third portion of the catalytic layer by planarizing the sacrificial passivation layer and the catalytic layer until the insulating layer is exposed; and
removing the planarized sacrificial passivation layer from the contact hole.

11. The method as claimed in claim 9, wherein the third portion of the catalytic layer is removed through a chemical mechanical polishing process immediately after forming the catalytic layer.

12. The method as claimed in claim 8, wherein an etching gas used in the anisotropic etching includes:
a chemical etching gas including carbon and fluorine; and
a physical etching gas.

13. The method as claimed in claim 12, wherein the chemical etching gas includes at least one of a carbon tetrafluoride gas and a trifluoromethane gas, and
the physical etching gas includes at least one of an oxygen gas and an argon gas.

14. The method as claimed in claim 8, wherein the anisotropic etching includes providing a back bias of about 1 watts to about 10 watts.

15. The method as claimed in claim 7, wherein forming the contact plug comprises:
growing a carbon nanotube higher than a top surface of the insulating layer, the carbon nanotube being grown from the first portion of the catalytic layer; and
removing a portion of the carbon nanotube that protrudes higher than the top surface of the insulating layer.

16. The method as claimed in claim 15, wherein removing the protruding portion of the carbon nanotube comprises:
forming a sacrificial planarization layer on the insulating layer, the sacrificial planarization layer covering the protruding portion of the carbon nanotube; and
planarizing the sacrificial planarization layer and the protruding portion of the carbon nanotube until the top surface of the insulating layer is exposed.

17. The method as claimed in claim 15, further comprising performing a plasma pre-treatment using an ammonia gas on the first portion of the catalytic layer before growing the carbon nanotube.

18. The method as claimed in claim 7, further comprising forming an upper conductive pattern on the insulating layer, the upper conductive pattern contacting the contact plug.

19. The method as claimed in claim 7, wherein the catalytic layer further includes a third portion on a top surface of the insulating layer, the method further comprising removing the third portion of the catalytic layer after forming the spacer.

20. The method as claimed in claim 19, wherein the third portion of the catalytic layer is removed using a chemical mechanical polishing process.

* * * * *